(12) United States Patent
Choi

(10) Patent No.: US 10,446,075 B2
(45) Date of Patent: Oct. 15, 2019

(54) ORGANIC LIGHT EMITTING DIODE DISPLAY DEVICE

(71) Applicant: SAMSUNG DISPLAY CO., LTD., Yongin-si, Gyeonggi-do (KR)

(72) Inventor: Chulhyun Choi, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 59 days.

(21) Appl. No.: 15/890,683

(22) Filed: Feb. 7, 2018

(65) Prior Publication Data
US 2018/0233079 A1  Aug. 16, 2018

(30) Foreign Application Priority Data
Feb. 10, 2017  (KR) .................. 10-2017-0018720

(51) Int. Cl.
*G09G 3/3208* (2016.01)
*H01L 27/32* (2006.01)
*H01L 51/52* (2006.01)
*G09G 3/3233* (2016.01)

(52) U.S. Cl.
CPC ....... *G09G 3/3208* (2013.01); *H01L 27/3246* (2013.01); *H01L 27/3258* (2013.01); *H01L 27/3276* (2013.01); *H01L 51/5203* (2013.01); *G09G 3/3233* (2013.01); *G09G 2300/0426* (2013.01); *G09G 2310/0264* (2013.01); *H01L 27/3218* (2013.01)

(58) Field of Classification Search
CPC ............. H01L 51/5203; H01L 27/3276; H01L 27/3258; H01L 27/3246; H01L 27/3218; G09G 2310/0264; G09G 2300/0426; G09G 3/3233; G09G 3/3208
See application file for complete search history.

(56) References Cited

U.S. PATENT DOCUMENTS

2003/0151568 A1 * 8/2003 Ozawa .................. G09G 3/30
345/82
2016/0329383 A1  11/2016 Li et al.

FOREIGN PATENT DOCUMENTS

| KR | 10-0700642 B1 | 3/2007 |
| KR | 10-0762686 B1 | 9/2007 |
| KR | 10-2016-0119081 A | 10/2016 |

* cited by examiner

*Primary Examiner* — Mihir K Rayan
(74) *Attorney, Agent, or Firm* — Lee & Morse, P.C.

(57) ABSTRACT

An organic light emitting display device includes a step difference compensation pattern that may reduce imbalance or asymmetry below a pixel electrode. The step difference compensation pattern is on a first protection layer and is separated from a conductive line. A second protection layer is on the conductive line and the first step difference compensation pattern. An organic light emitting layer is between the first electrode and a second electrode. The first electrode is on the second protection layer and overlaps at least a part of the conductive line and at least a part of the first step difference compensation pattern.

20 Claims, 9 Drawing Sheets

ORGANIC LIGHT EMITTING DIODE DISPLAY DEVICE

CROSS-REFERENCE TO RELATED APPLICATION

Korean Patent Application No. 10-2017-0018720, filed on Feb. 10, 2017, and entitled, "Organic Light Emitting Diode Display Device," is incorporated by reference herein in its entirety.

BACKGROUND

1. Field

One or more embodiments described herein relate to an organic light emitting diode display device.

2. Discussion of the Related Art

An OLED display device generates images based on light emitted from pixels that include OLEDs. This type of display device has relatively low power consumption, high luminance, and fast reaction speed. In an OLED display device, each pixel may have a multi-layer structure that includes the OLED. The lower portion of a pixel electrode of the pixel may be non-uniform or asymmetric. Such a structure may produce a color shift depending on viewing angle, e.g., the color of emitted light perceived by a viewer may vary depending on viewing direction.

SUMMARY

In accordance with one or more embodiments, an organic light emitting display device includes a substrate; a first protection layer on the substrate; a conductive line on the first protection layer; a first step difference compensation pattern on the first protection layer and separated from the conductive line; a second protection layer on the conductive line and the first step difference compensation pattern; a first electrode on the second protection layer and overlapping at least a part of the conductive line and at least a part of the first step difference compensation pattern; an organic light emitting layer on the first electrode; and a second electrode on the organic light emitting layer, wherein one side of the conductive line overlapping the first electrode corresponds to a first side, another side of the conductive line overlapping the first electrode corresponds to a second side, and at least one side of the first step difference compensation pattern overlapping the first electrode corresponds to a third side, and wherein a length of the first side is different from a length of the second side.

The third side may be substantially parallel to the first side and the second side. A difference between the length of the first side and the length of the second side may be substantially equal to a length of the third side. The first step difference compensation pattern may be a polygonal shape on a plane. The first step difference compensation pattern may be in a floating state. The first step difference compensation pattern may include substantially a same material as the conductive line. A thickness of the first step difference compensation pattern may be substantially equal to a thickness of the conductive line. The conductive line may be a driving voltage line.

The display device may include a second step difference compensation pattern; and a third step difference compensation pattern, wherein the second and third step difference compensation patterns are on the first protection layer and overlap at least part of the first electrode, and wherein: at least one side of the second step difference compensation pattern overlapping the first electrode corresponds to a fourth side, at least one side of the third step difference compensation pattern overlapping the first electrode corresponds to a fifth side, and an angle between the fourth and fifth sides and the first and second sides is about 90 degrees. A sum of a length of the fourth side and a length of the fifth side is substantially equal to one of the length of the first side and the length of the second side.

In accordance with one or more other embodiments, an organic light emitting display device includes a substrate; a first protection layer on the substrate; a mesh-shaped conductive line on the first protection layer and including a plurality of horizontal lines crossing a plurality of vertical lines; a step difference compensation pattern on the first protection layer and separated from the conductive line; a second protection layer on the conductive line and the step difference compensation pattern; a first electrode on the second protection layer and overlapping at least a part of the horizontal line, at least a part of the vertical line, and at least a part of the step difference compensation pattern; an organic light emitting layer on the first electrode; and a second electrode on the organic light emitting layer.

One side of the vertical line overlapping the first electrode corresponds to a first side, another side of the vertical line overlapping the first electrode corresponds to a second side, one side of the horizontal line overlapping the first electrode corresponds to a third side, another side of the horizontal line overlapping the first electrode corresponds to a fourth side, and two sides of the first step difference compensation pattern overlapping the first electrode correspond to fifth and sixth sides. A length of the first side is different from a length of the second side, a length of the third side is different from a length of the fourth side, the fifth side is substantially parallel to the first side and the second side, and the sixth side is substantially parallel to the third side and the fourth side.

A difference between the length of the first side and the length of the second side may be substantially equal to a length of the fifth side. A difference between the length of the third side and the length of the fourth side may be substantially equal to a length of the sixth side. The step difference compensation pattern may have a polygonal shape on a plane. The step difference compensation pattern may be in a floating state. The step difference compensation pattern may include substantially a same material as in the conductive line. The step difference compensation pattern may have a thickness substantially equal to a thickness of the conductive line. The conductive line may be a driving voltage line. An angle between one side of the first electrode and the conductive line may be an acute angle.

In accordance with one or more other embodiments, an organic light emitting display device includes a substrate; a first protection layer on the substrate; a mesh-shaped conductive line on the first protection layer and including a plurality of horizontal lines crossing a plurality of vertical lines; a connection electrode on the first protection layer and separated from the conductive line; a second protection layer on the conductive line and the connection electrode; a first electrode on the second protection layer and overlapping at least part of the horizontal line, at least part of the vertical line, and at least part of the connection electrode; an organic light emitting layer on the first electrode; and a second electrode on the organic light emitting layer.

One side of the vertical line overlapping the first electrode corresponds to a first side, another side of the vertical line overlapping the first electrode corresponds to a second side, one side of the horizontal line overlapping the first electrode corresponds to a third side, another side of the horizontal line overlapping the first electrode corresponds to a fourth side, and two sides of the connection electrode overlapping the first electrode correspond to a fifth side and a sixth side. A length of the first side is different from a length of the second side. A length of the third side is different from a length of the fourth side. The fifth side is substantially parallel to the first and second sides, and the sixth side is substantially parallel to the third side and the fourth side.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
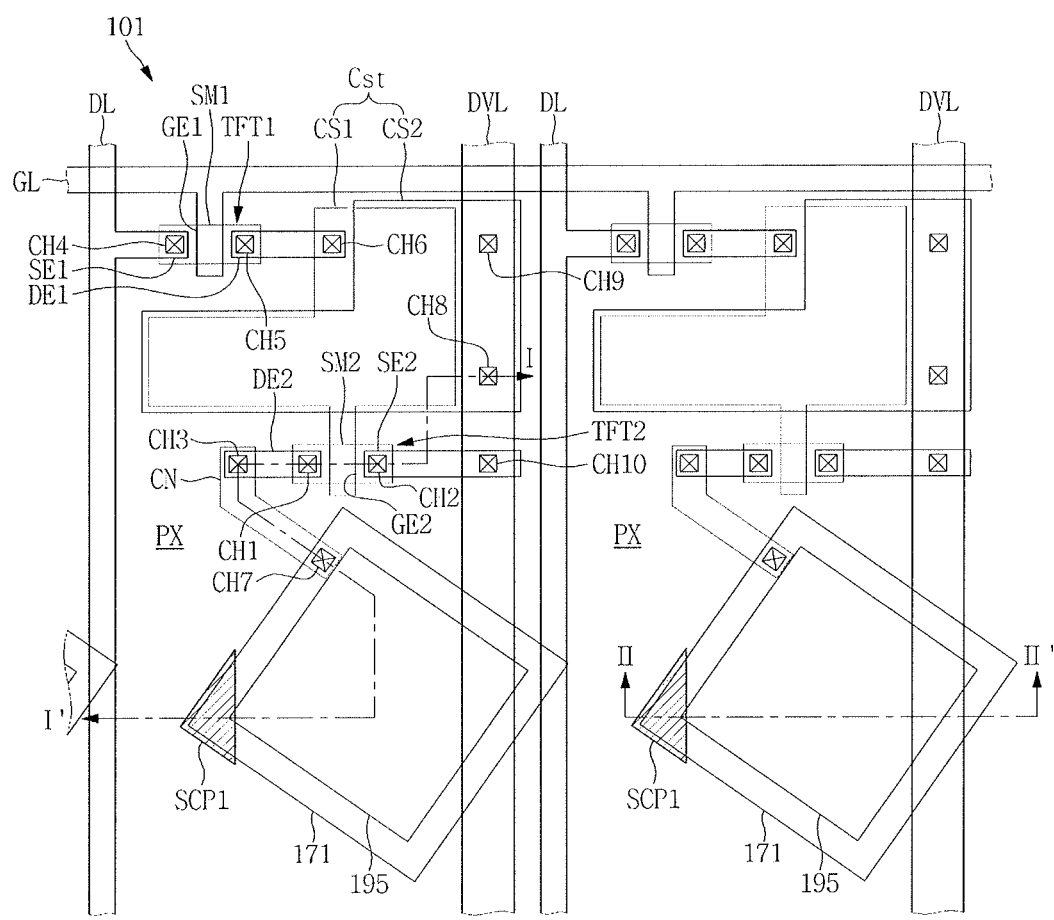
FIG. 1 illustrates a layout embodiment of an OLED display device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Exemplary embodiments will now be described more fully hereinafter with reference to the accompanying drawings. Although the invention may be modified in various manners and have several exemplary embodiments, exemplary embodiments are illustrated in the accompanying drawings and will be mainly described in the specification. However, the scope of the invention is not limited to the exemplary embodiments and should be construed as including all the changes, equivalents and substitutions included in the spirit and scope of the invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first." "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined at the present specification. Some of the parts which are not associated with the description may not be provided in order to specifically describe exemplary embodiments of the present invention and like reference numerals refer to like elements throughout the specification.

Figure 2:
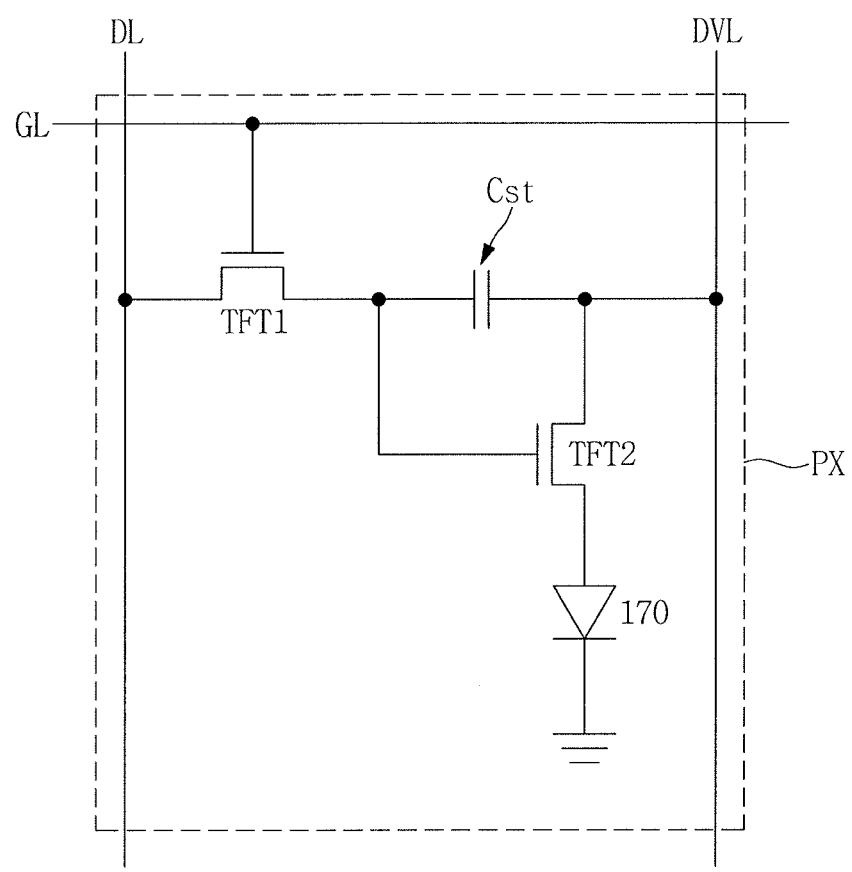
FIG. 2 illustrates a circuit embodiment of the pixel.
Figure 3:
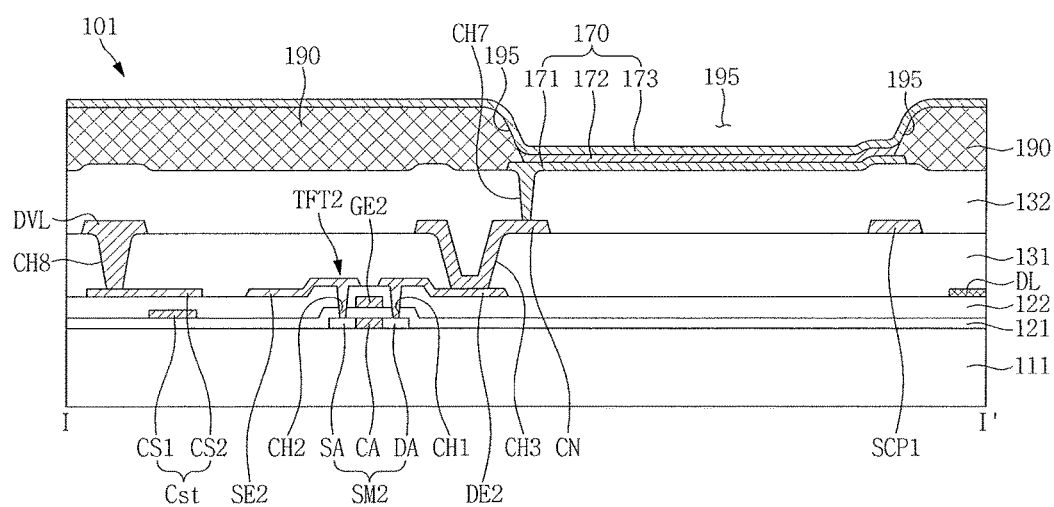
FIG. 3 illustrates a cross-sectional view taken along line I-I' of FIG. 1.
Figure 4:
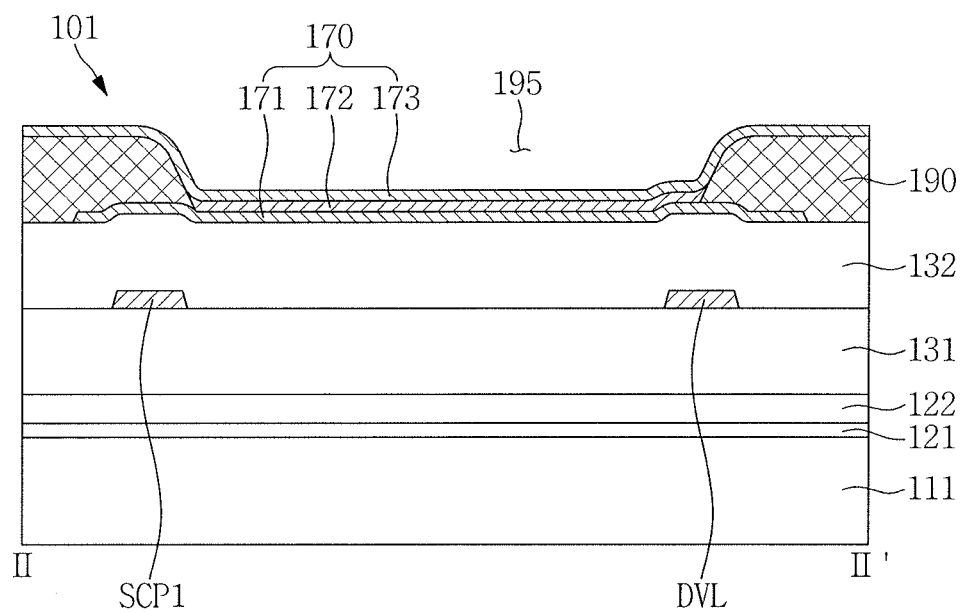
FIG. 4 illustrates a cross-sectional view taken along line II-II' of FIG. 1.

FIG. 1 illustrates a plan view of an embodiment of an organic light emitting diode (OLED) display device 101. FIG. 2 illustrates a circuit embodiment of the pixel of FIG. 1. FIG. 3 illustrates a cross-sectional view taken along the line I-I' of FIG. 1. FIG. 4 illustrates a cross-sectional view taken along the line II-II' of FIG. 1.

Referring to FIGS. 1 to 4, the OLED display device 101 includes a plurality of pixels PX. A pixel PX may refer to a smallest unit that emits light for displaying images. The pixel PX generates light of a predetermined color, for example, one of red, green, or blue. In another embodiment, the pixel may generate light of a different color of the light, e.g., cyan, magenta, yellow, or white.

The pixel PX may include, for example, a switching thin film transistor TFT1, a driving thin film transistor TFT2, an OLED 170, and a capacitor Cst. The pixel PX may be connected to a gate line GL, a data line DL, and a driving voltage line DVL. The gate line GL extends in one direction. The data line DL extends in another direction crossing the gate line GL. As illustrated in FIG. 1, the driving voltage line DVL may extend in a direction substantially the same as a direction in which the data line DL extends. The gate line GL transmits a scan signal, the data line DL transmits a data signal, and the driving voltage line DVL transmits a driving voltage.

The driving thin film transistor TFT2 may control the OLED 170 and the switching thin film transistor TFT1 may perform a switching operation relative to the driving thin film transistor TFT2. Each pixel PX in this exemplary embodiment includes two thin film transistors TFT1 and TFT2. Each pixel PX may include a different number of thin film transistors and/or capacitors in another exemplary embodiment, e.g., one thin film transistor and one capacitor or three or more thin film transistors and two or more capacitors.

A portion at which the thin film transistors TFT1 and TFT2, the gate line GL, the data line DL, the driving voltage line DVL, and the capacitor Cst are disposed may be referred to as a wiring portion. Each of the gate line GL, the data line DL, the driving voltage line DVL, and the capacitor Cst may be referred to as a wiring. In addition, the thin film transistors TFT1 and TFT2 may be one of the wirings or a part of the wirings. In addition, since the gate line GL, the data line DL, and the driving voltage line DVL have conductivity, each of them may be referred to as a conductive line.

The switching thin film transistor TFT1 includes a first gate electrode GE1, a first source electrode SE1, a first drain electrode DE1, and a first semiconductor layer SM1. The first gate electrode GE1 is connected to the gate line GL, and the first source electrode SE1 is connected to the data line DL.

The first drain electrode DE1 is connected to a first capacitor plate CS1 through a fifth contact hole CH5 and a sixth contact hole CH6. The switching thin film transistor TFT1 transmits a data signal from the data line DL to the driving thin film transistor TFT2 according to a scan signal applied to the gate line GL.

The driving thin film transistor TFT2 includes a second gate electrode GE2, a second source electrode SE2, a second drain electrode DE2, and a second semiconductor layer SM2. The second gate electrode GE2 is connected to the first capacitor plate CS1. The second source electrode SE2 is connected to the driving voltage line DVL through a tenth contact hole CH10. The second drain electrode DE2 is connected to a connection electrode CN through a third contact hole CH3, and the connection electrode CN is connected to a first electrode 171 through a seventh contact hole CH7.

An organic light emitting layer 172 is on the first electrode 171, and a second electrode 173 is on the organic light emitting layer 172. A common voltage is applied to the second electrode 173, and the organic light emitting layer 172 generates light according to an output signal of the driving thin film transistor TFT2.

The capacitor Cst is connected between the second gate electrode GE2 and the second source electrode SE2 of the driving thin film transistor TFT2. The capacitor Cst charges and maintains a signal input to the second gate electrode GE2 of the driving thin film transistor TFT2. The capacitor Cst includes the first capacitor plate CS1 connected to the first drain electrode DE1 through the sixth contact hole CH6 and a second capacitor plate CS2 connected to the driving voltage line DVL through an eighth contact hole CH8 and a ninth contact hole CH9.

Referring to FIG. 3, the thin film transistors TFT1 and TFT2 and the OLED 170 are on a substrate 111. The substrate 111 may include, for example, an insulating material such as glass, plastic, quartz, or the like. The material for the substrate 111 may be selected, for example, from materials which are excellent in mechanical strength, thermal stability, transparency, surface smoothness, ease of handling, and/or water resistance.

A buffer layer may be on the substrate 111 to substantially prevent diffusion of impurities into the switching thin film transistor TFT1 and the driving thin film transistor TFT2.

The first semiconductor layer SM1 and the second semiconductor layer SM2 are on the substrate 111. The first semiconductor layer SM1 and the second semiconductor layer SM2 include a semiconductor material and serve as active layers of the switching thin film transistor TFT1 and the driving thin film transistor TFT2, respectively. Each of the first semiconductor layer SM1 and the second semiconductor layer SM2 includes a source area SA, a drain area DA, and a channel area CA between the source area SA and the drain area DA.

The first semiconductor layer SM1 and the second semiconductor layer SM2 may include, for example, amorphous silicon or polycrystalline silicon, or may include, for example, an oxide semiconductor. For example, each of the first semiconductor layer SM1 and the second semiconductor layer SM2 may include an inorganic semiconductor material or an organic semiconductor material. The source area SA and the drain area DA may be doped with an n-type impurity or a p-type impurity.

A gate insulating layer 121 is on the first semiconductor layer SM1 and the second semiconductor layer SM2. The gate insulating layer 121 protects the first semiconductor layer SM1 and the second semiconductor layer SM2. The gate insulating layer 121 may include an organic insulating material or an inorganic insulating material.

The first gate electrode GE1 and the second gate electrode GE2 are on the gate insulating layer 121. The first gate electrode GE1 and the second gate electrode GE2 are disposed to overlap the channel areas CA of the first semiconductor layer SM1 and the second semiconductor layer SM2, respectively. In addition, the first capacitor plate CS1 is on the gate insulating layer 121. The second gate electrode GE2 and the first capacitor plate CS1 may have, for example, a unitary structure.

An insulating interlayer 122 is on the first gate electrode GE1 the second gate electrode GE2, and the first capacitor plate CS1. The insulating interlayer 122 may include an organic insulating material or an inorganic insulating material.

The first source electrode SE1, the first drain electrode DE1, the second source electrode SE2, and the second drain electrode DE2 are on the insulating interlayer 122. The second drain electrode DE2 contacts the drain area DA of the second semiconductor layer SM2 through a first contact hole CH1 defined at the gate insulating layer 121 and the insulating interlayer 122. The second source electrode SE2 contacts the source area SA of the second semiconductor layer SM2 through a second contact hole CH2 defined at the gate insulating layer 121 and the insulating interlayer 122. The first source electrode SE1 contacts the first semiconductor layer SM1 through a fourth contact hole CH4 defined at the gate insulating layer 121 and the insulating interlayer 122. The first drain electrode DE1 contacts the first semiconductor layer SM1 through the fifth contact hole CH5 defined at the gate insulating layer 121 and the insulating interlayer 122. In addition, the data line DL and the second capacitor plate CS2 are on the insulating interlayer 122.

A first protection layer 131 is on the first source electrode SE1, the first drain electrode DE1, the second source electrode SE2, the second drain electrode DE2, the data line DL, and the second capacitor plate CS2. The first protection layer 131 serves to protect the switching thin film transistor TFT1 and the driving thin film transistor TFT2 and also serves to planarize upper surfaces thereof.

According to a first exemplary embodiment, the first protection layer 131 may include a photosensitive material. For example, the first protection layer 131 may include a photosensitive polymer resin.

The driving voltage line DVL, the connection electrode CN, and a first step difference compensation pattern SCP1 are on the first protection layer 131. The driving voltage line DVL, the connection electrode CN, and the first step difference compensating pattern SCP1 may be manufactured substantially in a same process using a substantially same material.

In an exemplary embodiment, the driving voltage line DVL includes a conductive material. For example, the driving voltage line DVL may include or be formed entirely of aluminum (Al) or alloys thereof, silver (Ag) or alloys thereof, copper (Cu) or alloys thereof, molybdenum (Mo) or alloys thereof, chromium (Cr), tantalum (Ta), and/or titanium (Ti). In an exemplary embodiment, the driving voltage line DVL may have a multilayer structure including a refractory metal layer and a low-resistance conductive layer.

As such, the driving voltage line DVL is a conductive line including a conductive material.

The driving voltage line DVL is connected to the second capacitor plate CS2 through the eighth contact hole CH8 and the ninth contact hole CH9 defined at the first protection layer 131. In addition, the driving voltage line DVL is connected to the second source electrode SE2 through the tenth contact hole CH10 defined at the first protection layer 131.

The connection electrode CN is connected to the second drain electrode DE2 through the third contact hole CH3 defined at the first protection layer 131.

The first step difference compensation pattern SCP1 is separated from the driving voltage line DVL and, for example, may be in a floating state under at least some conditions. The first step difference compensation pattern SCP1 may be formed to have a thickness substantially equal to a thickness of the driving voltage line DVL.

A second protection layer 132 is on the driving voltage line DVL and the connecting electrode CN. According to an exemplary embodiment, the second protection layer 132 may include a photosensitive material, e.g., a photosensitive polymer resin.

The second protection layer 132 serves to protect the driving voltage line DVL and the connection electrode CN and also serves to planarize upper surfaces of the driving voltage line DVL and the connection electrode CN. However, when the driving voltage line DVL and the connecting electrode CN are thick (e.g., thicker than a predetermined value), the upper portion of the driving voltage line DVL and the connecting electrode CN may not be completely planarized by the second protection layer 132.

For example, in some OLED displays, a large amount of current or data may be transmitted with wirings that have a small planar area. This may occur, for example, when various wirings are integrated. Under these circumstances, the wiring may become thick. As a result, the upper portion of the wirings (e.g., the driving voltage line DVL and the connecting electrode CN) may not be completely planarized, even when the second protection layer 132 is on an upper portion of such wirings.

Thus, according to an exemplary embodiment, the first level difference compensation pattern SCP1 is disposed on the first passivation layer 131 to offset or alleviate imbalance or asymmetry of a wiring below the first electrode 171 due to the driving voltage line DVL.

The first electrode 171 is on the second protection layer 132 and may be arranged to overlap at least a part of the driving voltage line DVL and at least a part of the first step difference compensation pattern SCP1. An example of a planar arrangement of the driving voltage line DVL, the first step difference compensation pattern SCP1, and the first electrode 171 will be described below.

The first electrode 171 may be, for example, an anode. The first electrode 171 according to a first exemplary embodiment is a pixel electrode. The first electrode 171 is connected to the connection electrode CN through the seventh contact hole CH7 defined at the second protection layer 132. Because the connection electrode CN is connected to the second drain electrode DE2 through the third contact hole CH3 defined at the first protection layer 131, the first electrode 171 may be electrically connected to the second drain electrode DE2 of the driving thin film transistor TFT2.

Referring to FIG. 1, the driving voltage line DVL according to a first exemplary embodiment may have a straight line shape. In another exemplary embodiment, the driving voltage line DVL may have a different shape, e.g., a curved line shape or a broken line shape. Also, in one embodiment, the angle between one side of the first electrode 171 and the driving voltage line DVL may be an acute angle.

A pixel defining layer 190 that divides a light emission area is on the second protection layer 132. The pixel defining layer 190 may include a polymer organic material. For example, the pixel defining layer 190 may include at least one of a polyimide (PI) resin, a polyacrylic resin, a PET resin, and a PEN resin. The pixel defining layer 190 defines an opening 195, and the first electrode 171 is exposed from the pixel defining layer 190 through the opening 195. The light emission area of the OLED 170 is defined by the opening 195.

Referring to FIGS. 1 and 3, the first electrode 171 overlaps at least part of the pixel defining layer 190 and does not overlap the pixel defining layer 190 at the opening 195. The first electrode 171 has conductivity and, for example, may be a transmissive electrode, a transflective electrode, or a reflective electrode. When the first electrode 171 is a transmissive electrode, the first electrode 171 may include a transparent conductive oxide. For example, the transparent conductive oxide may include at least one of indium tin oxide (ITO), indium zinc oxide (IZO), zinc oxide (ZnO), and indium tin zinc oxide (ITZO). When the first electrode 171 is a transflective electrode or a reflective electrode, the first electrode 171 may include, for example, at least one of Ag, Mg, Al, Pt, Pd, Au, Ni, Nd, Ir, Cr, and Cu.

The organic light emitting layer 172 is on the first electrode 171. For example, the organic light emitting layer 172 may be on the first electrode 171 at the opening 195. The organic light emitting layer 172 may be on a sidewall of the opening 195 defined by the pixel defining layer 190 and on the pixel defining layer 190.

The organic light emitting layer 172 includes a light emitting material. In one embodiment, the organic light emitting layer 172 may include a host and a light emitting dopant. The organic light emitting layer 172 may be manufactured using various semiconductor processes using a light emitting material. For example, the organic light emitting layer 172 may be formed by a vacuum deposition method, a spin coating method, a cast method, a Langmuir-Blodgett (LB) method, an inkjet printing method, a laser printing method, or a laser induced thermal imaging (LITI) method.

At least one of a hole injection layer (HIL) and a hole transport layer (HTL) may be between the first electrode 171 and the organic light emitting layer 172.

The second electrode 173 is on the organic light emitting layer 172 and, for example, may be a common electrode and may be a cathode. The second electrode 173 may be, for example, a transmissive electrode, a transflective electrode, or a reflective electrode.

When the second electrode 173 is a transmissive electrode, the second electrode 173 may include, for example, at least one of Li, Ca, LiF/Ca, LiF/Al, Al, Mg, BaF, Ba, Ag, and Cu. In one embodiment, the second electrode 173 may include a mixture of Ag and Mg.

When the second electrode 173 is a transflective electrode or a reflective electrode, the second electrode 173 may include, for example, at least one of Ag, Mg, Al, Pt, Pd, Au, Ni, Nd, Ir, Cr, Li, Ca, LiF/Ca, LiF/Al, Mo, Ti, and Cu. Alternatively, or additionally, the second electrode 173 may also include a transparent conductive layer including, for example, indium tin oxide (ITO), indium zinc oxide (IZO), zinc oxide (ZnO), and indium-zinc-tin oxide (IZTO), as well as the transflective electrode or the reflective electrode.

At least one of an electron transport layer (ETL) and an electron injection layer (EIL) may be between the organic light emitting layer 172 and the second electrode 173.

When the OLED 170 is a top-emission type, the first electrode 171 may be a reflective electrode and the second electrode 173 may be a transmissive electrode or a transflective electrode. When the OLED 170 is a bottom-emission type, the first electrode 171 may be a transmissive electrode or a transflective electrode, and the second electrode 173 may be a reflective electrode.

Figure 5:
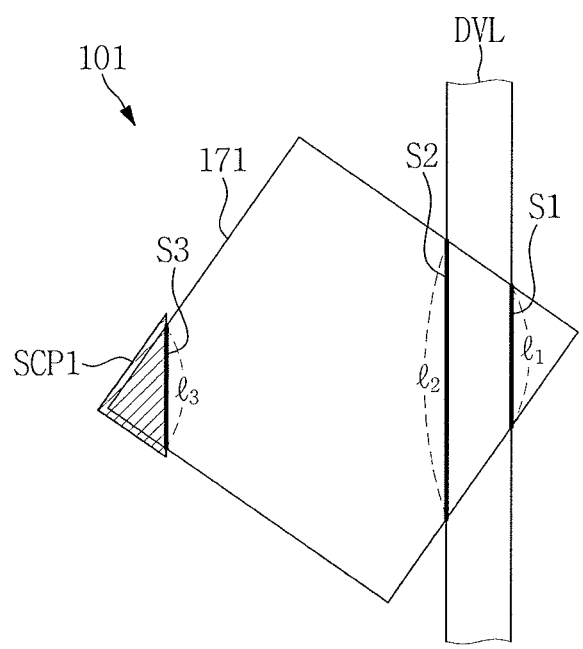
FIG. 5 illustrates an embodiment of a driving voltage line, a step difference compensation pattern, and a pixel electrode.
Figure 6:
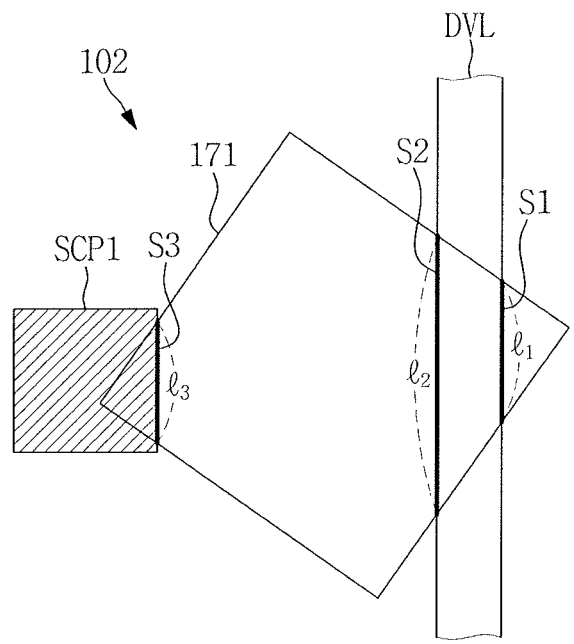
FIG. 6 illustrates another embodiment of a driving voltage line, a step difference compensation pattern, and a pixel electrode.

FIG. 5 illustrates a plan view of an embodiment of a driving voltage line, a step difference compensation pattern, and a pixel electrode of FIG. 1. FIG. 6 illustrates a plan view of another embodiment of a driving voltage line, a step difference compensation pattern, and a pixel electrode.

Referring to FIGS. 5 and 6, an OLED display device 101 according to one exemplary embodiment and an OLED display device 102 according to another exemplary embodiment may include a driving voltage line DVL having a straight line shape and a first step difference compensation pattern SCP1 separated from the driving voltage line DVL.

The first step difference compensation pattern SCP1 is separated from the driving voltage line DVL. The first step difference compensation pattern SCP1 may be on substantially the same layer as the driving voltage line DVL is on. The first step difference compensation pattern SCP1 may have a predetermined shape, e.g., a triangular shape (see FIG. 5) or a quadrangular shape (see FIG. 6) on a plane. The first step difference compensation pattern SCP1 may have a different shape (e.g., a polygonal shape) on a plane in another embodiment.

The first step difference compensation pattern SCP1 and the driving voltage line DVL may be manufactured in substantially a same process and with substantially a same material. In another embodiment, the first step difference compensation pattern SCP1 may be manufactured using a material different from a material in the driving voltage line DVL. For example, the first step difference compensation pattern SCP1 may include an insulating material.

The first step difference compensation pattern SCP1 may have a thickness substantially equal to a thickness of the driving voltage line DVL.

The first electrode 171 may overlap at least a part of the driving voltage line DVL and at least a part of the first step difference compensating pattern SCP1. For example, when one side of the driving voltage line DVL overlapping the first electrode 171 is defined as a first side S1, another side of the driving voltage line DVL overlapping the first electrode 171 is defined as a second side S2, and one side of the first step difference compensation pattern SCP1 overlapping the first electrode 171 is defined as a third side S3, the length l1 of the first side S1 may be different from the length l2 of the second side S2. The third side S3 may be substantially parallel to the first side S1 and the second side S2. In one embodiment, the difference between the length l1 of the first side S1 and the length l2 of the second side S2 may be substantially equal to a length l3 of the third side S3.

As such, since the first step difference compensation pattern SCP1 is on a first protection layer 131 in the OLED display devices according to first and second exemplary embodiments, imbalance or asymmetry of a wiring below a first electrode 171 due to the driving voltage line DVL may be reduced or alleviated.

Figure 7:
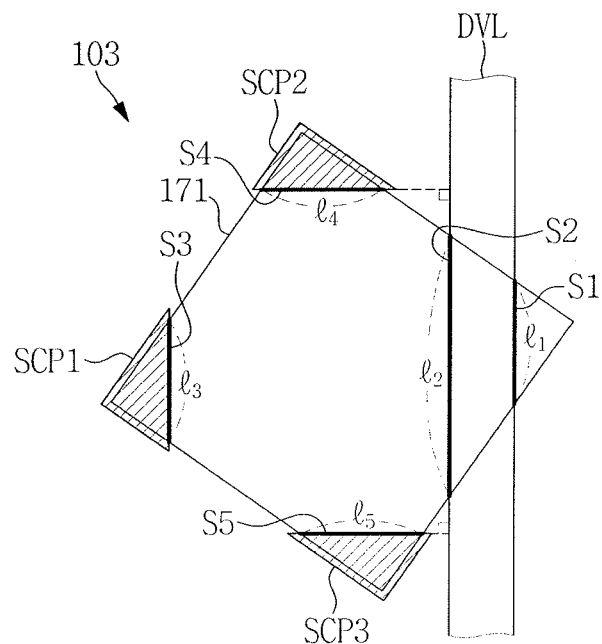
FIG. 7 illustrates another embodiment of a driving voltage line, a step difference compensation pattern, and a pixel electrode.

FIG. 7 illustrates a plan view of another embodiment of a driving voltage line, a step difference compensation pattern, and a pixel electrode. Referring to FIG. 7, an OLED display device 103 according to this exemplary embodiment may include a driving voltage line DVL having a straight line shape, and first, second, and third step difference compensation patterns SCP1, SCP2, and SCP3 that are separated from the driving voltage line DVL. Each of the first, second, and third step difference compensation patterns SCP1, SCP2, and SCP3 may be separated from the driving voltage line DVL and may be on substantially the same as a layer as the driving voltage line DVL is on. The first, second, and third step difference compensation patterns SCP1, SCP2, and SCP3 may have a predetermined (e.g., a polygonal) shape on a plane.

The first, second, and third step difference compensation patterns SCP1, SCP2, and SCP3 and the driving voltage line DVL may be manufactured in substantially a same process using substantially a same material. In one embodiment, the first, second, and third step difference compensation patterns SCP1, SCP2, and SCP3 may be manufactured using a material different from a material in the driving voltage line DVL.

The first, second, and third step difference compensation patterns SCP1, SCP2, and SCP3 may have a thickness substantially equal to the thickness of the driving voltage line DVL.

The first electrode 171 may overlap at least part of the driving voltage line DVL, at least a part of the first step difference compensation pattern SCP1, at least a part of the second step difference compensation pattern SCP2, and at least a part of the third step difference compensation pattern SCP3.

For example, when one side of the driving voltage line DVL overlapping the first electrode 171 is defined as a first side S1, another side of the driving voltage line DVL overlapping the first electrode 171 is defined as a second side S2, and one side of the first step difference compensation pattern SCP1 overlapping the first electrode 171 is defined as a third side S3, the length l1 of the first side S1 may be different from the length l2 of the second side S2. The third side S3 may be substantially parallel to the first side S1 and the second side S2. In one embodiment, the difference between the length l1 of the first side S1 and the length l2 of the second side S2 may be substantially equal to a length l3 of the third side S3.

When one side of the second step difference compensation pattern SCP2 overlapping the first electrode 171 is defined as a fourth side S4 and one side of the third step difference compensation pattern SCP3 overlapping the first electrode 171 is defined as a fifth side S5, the angle between each of the fourth side S4 and the fifth side S5 and the first side S1 or the second side S2 may be a predetermined angle, e.g., about 90 degrees.

In addition, the sum of a length l4 of the fourth side S4 and a length l5 of the fifth side S5 may be substantially equal to one of the length l1 of the first side S1 and the length l2 of the second side S2. For example, the sum of the length l4 of the fourth side S4 and the length l5 of the fifth side S5 may be substantially equal to the greater of the length l1 of the first side S1 and the length l2 of the second side S2.

Since the first, second, and third step difference compensating patterns SCP1, SCP2, and SCP3 are on a first protection layer 131 in the OLED display device, imbalance or asymmetry of a wiring below a first electrode 171 due to the driving voltage line DVL may be reduced or alleviated.

Figure 8:
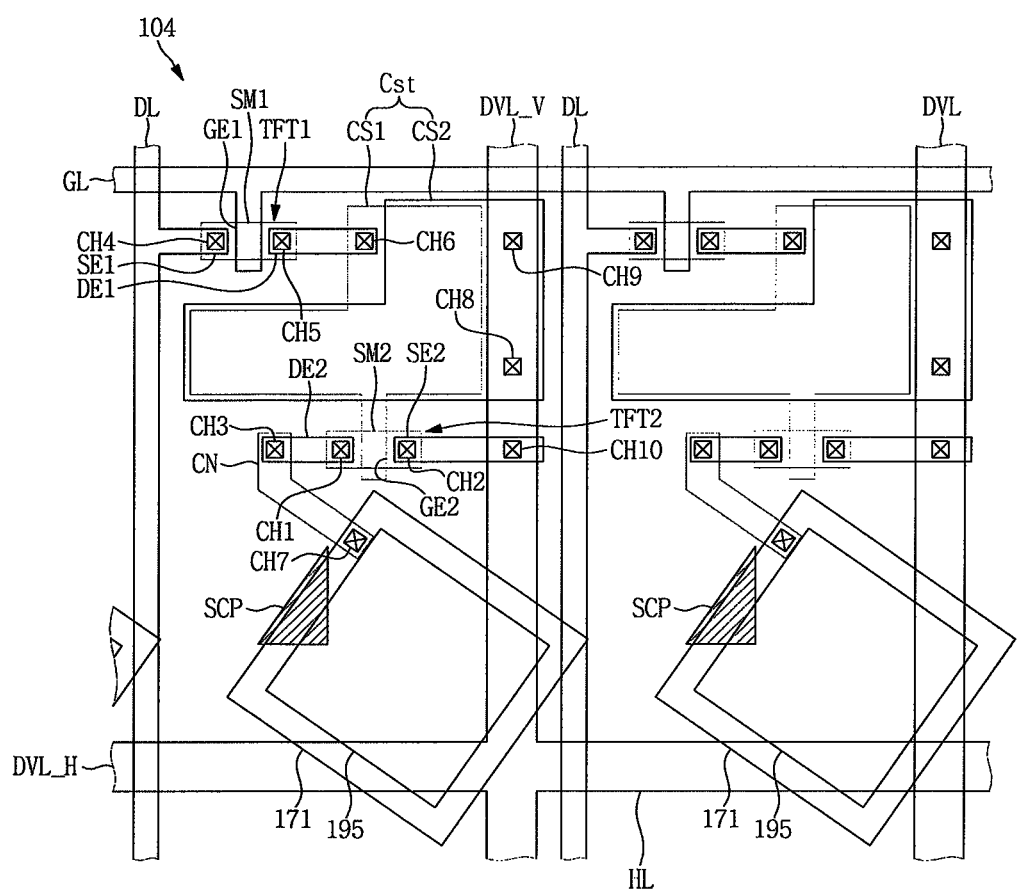
FIG. 8 illustrates another embodiment of an OLED display device.
Figure 9:
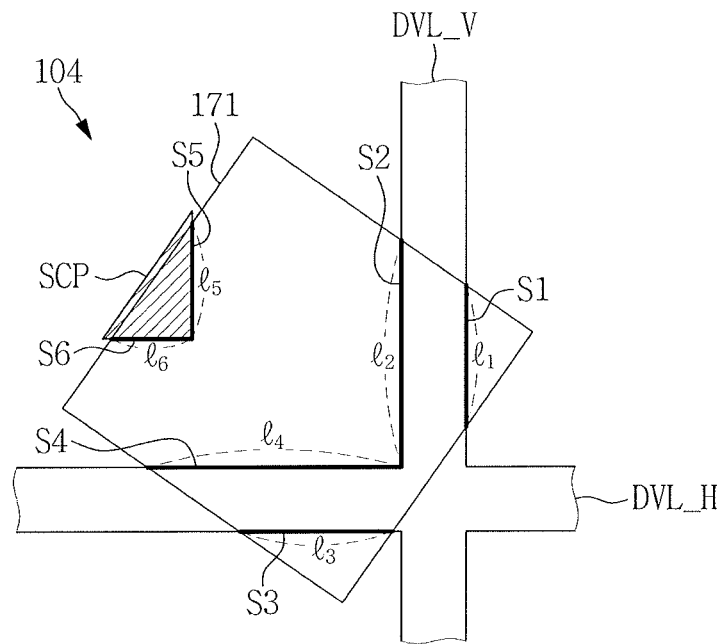
FIG. 9 illustrates another embodiment of a driving voltage line, a step difference compensation pattern, and a pixel electrode.
Figure 10:
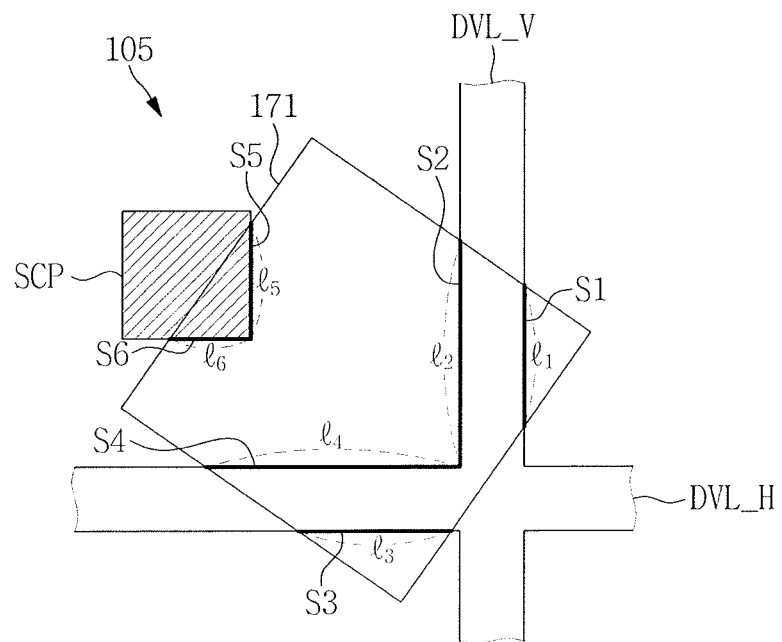
FIG. 10 illustrates another embodiment of a driving voltage line, a step difference compensation pattern, and a pixel electrode.

FIG. 8 illustrates a plan view of another embodiment of a pixel of an OLED display device. FIG. 9 illustrates a plan view of another embodiment of a driving voltage line, a step difference compensation pattern, and a pixel electrode. FIG. 10 illustrates a plan view of another embodiment of a driving voltage line, a step difference compensation pattern, and a pixel electrode.

Referring to FIGS. 8, 9, and 10, an OLED display device 104 and an OLED display device 105 may include a switching thin film transistor TFT1, a driving thin film transistor TFT2, an OLED, and a capacitor Cst.

Driving voltage lines include a plurality of horizontal lines DVL_H and a plurality of vertical lines DVL_V that cross each other in a mesh shape. Since the driving voltage lines DVL_H and DVL_V have conductivity, they may be also referred to as conductive lines.

A step difference compensation pattern SCP is separated from the driving voltage lines DVL_H and DVL_V and may be on substantially the same layer as the driving voltage lines DVL_H and DVL_V are on. The step difference compensation pattern SCP may have a predetermined shape. e.g., triangular shape in FIGS. 7 and 8 or a quadrangular shape in FIG. 9 on a plane. The step difference compensation pattern SCP may have a different (e.g., polygonal) shape on a plane.

The step difference compensation pattern SCP and the driving voltage lines DVL_H and DVL_V may be manufactured in substantially a same process using substantially a same material. In one embodiment, the step difference compensation pattern SCP may include a material different from a material in the driving voltage lines DVL_H and DVL_V. For example, the step difference compensation pattern SCP may include an insulating material. The step difference compensation pattern SCP may have a thickness substantially equal to the thickness of the driving voltage lines DVL_H and DVL_V.

The first electrode 171 may overlap at least a part of the vertical line DVL_V, at least a part of the horizontal line DVL_H, and at least a part of the step difference compensating pattern SCP.

For example, when one side of the vertical line DVL_V overlapping the first electrode 171 is defined as a first side S1, another side of the vertical line DVL_V overlapping the first electrode 171 is defined as a second side S2, one side of the horizontal line DVL_H overlapping the first electrode 171 is defined as a third side S3, another side of the horizontal line DVL_H overlapping the first electrode 171 is defined as a fourth side S4, and two sides of the step difference compensation pattern SCP overlapping the first electrode 171 are defined as a fifth side S5 and a sixth side S6, the length l1 of the first side S1 may be different from the length l2 of the second side S2, the length l3 of the third side S3 may be different from the length l4 of the fourth side S4, the fifth side S5 may be substantially parallel to the first side S1 and the second side S2, and the sixth side S6 may be substantially parallel to the third side S3 and the fourth side S4.

In one embodiment, the difference between the length l1 of the first side S1 and the length l2 of the second side S2 may be substantially equal to a length l5 of the fifth side S5. Also, the difference between the length l3 of the third side S3 and the length l4 of the fourth side S4 may be substantially equal to a length l6 of the sixth side S6.

Since the step difference compensation pattern SCP is on a first protection layer in the OLED display devices 104 and 105, imbalance or asymmetry of a wiring below a first electrode 171 due to the driving voltage lines DVL_H and DVL_V may be reduced or alleviated.

Figure 11:
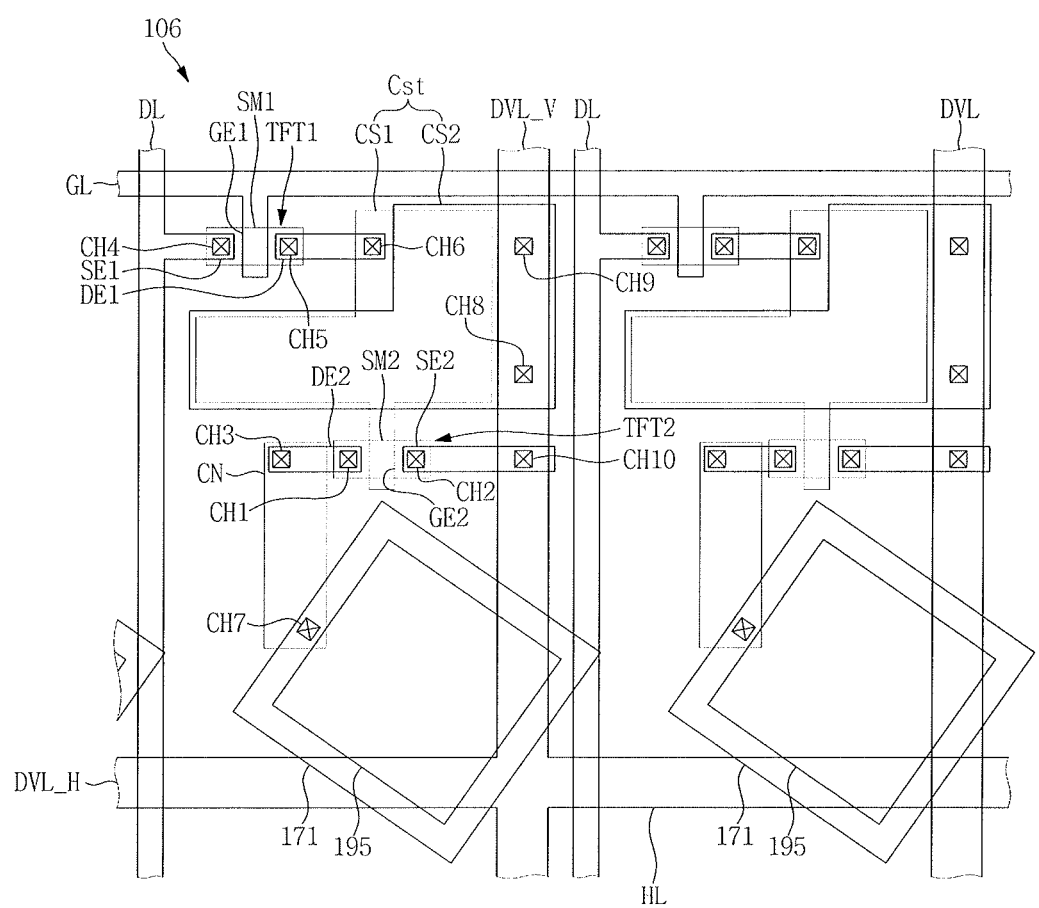
FIG. 11 illustrates another embodiment of a driving voltage line, a step difference compensation pattern, and a pixel electrode.

FIG. 11 illustrates a plan view of another embodiment of a driving voltage line, a step difference compensation pattern, and a pixel electrode. Referring to FIG. 11, an OLED display device 106 may include a driving voltage line DVL having a straight line shape and a connection electrode CN disposed apart from the driving voltage line DVL.

The connection electrode CN may be on substantially the same layer as the driving voltage line DVL is on and may have a predetermined (e.g., polygonal) shape on a plane. The connection electrode CN may have a thickness substantially equal to the thickness of the driving voltage line DVL.

The first electrode 171 may overlap at least part of the driving voltage line DVL and at least part of the connection electrode CN. The planar area and length of the connection electrode CN overlapping the first electrode 171 may be substantially identical to those of one or more other embodiments described herein. The OLED display device 106 may reduce or alleviate imbalance or asymmetry of a wiring below a first electrode 171 due to the driving voltage line DVL by disposing the connection electrode CN.

In accordance with one or more embodiments, an OLED display device may substantially prevent a color shift depending on viewing angle by adding a step difference compensation pattern below the pixel electrode. The step difference compensation pattern may reduce or alleviate imbalance or asymmetry below the pixel electrode.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. An organic light emitting display device, comprising:
a substrate;
a first protection layer on the substrate;
a conductive line on the first protection layer;
a first step difference compensation pattern on the first protection layer and separated from the conductive line;
a second protection layer on the conductive line and the first step difference compensation pattern;
a first electrode on the second protection layer and overlapping at least a part of the conductive line and at least a part of the first step difference compensation pattern;
an organic light emitting layer on the first electrode; and
a second electrode on the organic light emitting layer, wherein one side of the conductive line overlapping the first electrode corresponds to a first side, another side of the conductive line overlapping the first electrode corresponds to a second side, and at least one side of the first step difference compensation pattern overlapping the first electrode corresponds to a third side, and wherein a length of the first side is different from a length of the second side.

2. The display device of claim 1, wherein the third side is substantially parallel to the first side and the second side.

3. The display device of claim 1, wherein a difference between the length of the first side and the length of the second side is substantially equal to a length of the third side.

4. The display device of claim 1, wherein the first step difference compensation pattern has a polygonal shape on a plane.

5. The display device of claim 1, wherein the first step difference compensation pattern is in a floating state.

6. The display device of claim 1, wherein the first step difference compensation pattern includes substantially a same material as the conductive line.

7. The display device of claim 1, wherein a thickness of the first step difference compensation pattern is substantially equal to a thickness of the conductive line.

8. The display device of claim 1, wherein the conductive line is a driving voltage line.

9. The display device of claim 1, further comprising:
a second step difference compensation pattern; and
a third step difference compensation pattern,
wherein the second and third step difference compensation patterns are on the first protection layer and overlap at least part of the first electrode, and wherein:
at least one side of the second step difference compensation pattern overlapping the first electrode corresponds to a fourth side, at least one side of the third step difference compensation pattern overlapping the first electrode corresponds to a fifth side, and an angle between the fourth and fifth sides and the first and second sides is about 90 degrees.

10. The display device of claim 9, wherein a sum of a length of the fourth side and a length of the fifth side is substantially equal to one of the length of the first side and the length of the second side.

11. An organic light emitting display device, comprising:
a substrate;
a first protection layer on the substrate;
a mesh-shaped conductive line on the first protection layer and including a plurality of horizontal lines crossing a plurality of vertical lines;
a step difference compensation pattern on the first protection layer and separated from the conductive line;
a second protection layer on the conductive line and the step difference compensation pattern;
a first electrode on the second protection layer and overlapping at least a part of the horizontal line, at least a part of the vertical line, and at least a part of the step difference compensation pattern;
an organic light emitting layer on the first electrode; and
a second electrode on the organic light emitting layer, wherein one side of the vertical line overlapping the first electrode corresponds to a first side, another side of the vertical line overlapping the first electrode corresponds to a second side, one side of the horizontal line overlapping the first electrode corresponds to a third side, another side of the horizontal line overlapping the first electrode corresponds to a fourth side, and two sides of the first step difference compensation pattern overlapping the first electrode correspond to a fifth side and a sixth side, and wherein:
a length of the first side is different from a length of the second side,
a length of the third side is different from a length of the fourth side,
the fifth side is substantially parallel to the first side and the second side, and
the sixth side is substantially parallel to the third side and the fourth side.

12. The display device of claim 11, wherein a difference between the length of the first side and the length of the second side is substantially equal to a length of the fifth side.

13. The display device of claim 11, wherein a difference between the length of the third side and the length of the fourth side is substantially equal to a length of the sixth side.

14. The display device of claim 11, wherein the step difference compensation pattern has a polygonal shape on a plane.

15. The display device of claim 11, wherein the step difference compensation pattern is in a floating state.

16. The display device of claim 11, wherein the step difference compensation pattern includes substantially a same material as in the conductive line.

17. The display device of claim 11, wherein the step difference compensation pattern has a thickness substantially equal to a thickness of the conductive line.

18. The display device of claim 11, wherein the conductive line is a driving voltage line.

19. The display device of claim 11, wherein an angle between one side of the first electrode and the conductive line is an acute angle.

20. An organic light emitting display device, comprising:
   a substrate;
   a first protection layer on the substrate;
   a mesh-shaped conductive line on the first protection layer and including a plurality of horizontal lines crossing a plurality of vertical lines;
   a connection electrode on the first protection layer and separated from the conductive line;
   a second protection layer on the conductive line and the connection electrode;
   a first electrode on the second protection layer and overlapping at least part of the horizontal line, at least part of the vertical line, and at least part of the connection electrode;
   an organic light emitting layer on the first electrode; and
   a second electrode on the organic light emitting layer,
   wherein one side of the vertical line overlapping the first electrode corresponds to a first side, another side of the vertical line overlapping the first electrode corresponds to a second side, one side of the horizontal line overlapping the first electrode corresponds to a third side, another side of the horizontal line overlapping the first electrode corresponds to a fourth side, and two sides of the connection electrode overlapping the first electrode correspond to a fifth side and a sixth side,
   a length of the first side is different from a length of the second side,
   a length of the third side is different from a length of the fourth side,
   the fifth side is substantially parallel to the first side and the second side, and
   the sixth side is substantially parallel to the third side and the fourth side.

* * * * *